United States Patent
Han et al.

(10) Patent No.: US 12,402,437 B2
(45) Date of Patent: Aug. 26, 2025

(54) FLEXIBILITY-ASSISTED HEAT REMOVAL IN THIN CRYSTALLINE SILICON SOLAR CELLS

(71) Applicant: UNM RAINFOREST INNOVATIONS, Albuquerque, NM (US)

(72) Inventors: Sang Eon Han, Albuquerque, NM (US); Sang M. Han, Albuquerque, NM (US); Seok Jun Han, Albuquerque, NM (US)

(73) Assignee: UNM RAINFOREST INNOVATIONS, Albuquerque, NM (US)

( * ) Notice: Subject to any disclaimer, the term of this patent is extended or adjusted under 35 U.S.C. 154(b) by 176 days.

(21) Appl. No.: 17/636,271

(22) PCT Filed: Sep. 3, 2020

(86) PCT No.: PCT/US2020/049258
§ 371 (c)(1),
(2) Date: Feb. 17, 2022

(87) PCT Pub. No.: WO2021/046258
PCT Pub. Date: Mar. 11, 2021

(65) Prior Publication Data
US 2022/0293802 A1    Sep. 15, 2022

Related U.S. Application Data

(60) Provisional application No. 62/895,812, filed on Sep. 4, 2019.

(51) Int. Cl.
*H10F 77/70*    (2025.01)
*H10F 10/165*    (2025.01)

(52) U.S. Cl.
CPC ......... *H10F 77/703* (2025.01); *H10F 10/165* (2025.01)

(58) Field of Classification Search
CPC ........... H01L 31/02363; H01L 31/0745; H01L 31/1804; H01L 31/1872; H10F 77/703; H10F 10/165
See application file for complete search history.

(56) References Cited

U.S. PATENT DOCUMENTS 3,150,999 A    9/1964    Rudenberg et al.
9,530,906 B2 *    12/2016    Han ...................... H10F 71/103
(Continued)

FOREIGN PATENT DOCUMENTS

JP    2003158274 A    5/2003
RU    2555197 C1    7/2015
(Continued)

OTHER PUBLICATIONS

WO-2015/045263-A1 translation provided by FIT database, translated on Jul. 27, 2024.*
(Continued)

*Primary Examiner* — Golam Mowla
(74) *Attorney, Agent, or Firm* — MH2 Technology Law Group LLP (57) ABSTRACT

A flexible, non-flat solar cell comprises a flexible substrate. A pn junction is on or in the flexible substrate. The solar cell has been flexed so as to have a non-flat geometry that results in an increased surface area of the flexed solar cell with respect to the surface area of a flat solar cell that is the same as the flexed solar cell except that the flat solar cell has a flat surface geometry that has the same projected area on a lateral plane as does the flexed solar cell.

8 Claims, 7 Drawing Sheets

(56) References Cited

U.S. PATENT DOCUMENTS

| | | | |
|---|---|---|---|
| 9,941,426 B2 | 4/2018 | Han et al. | |
| 10,483,415 B2 | 11/2019 | Han et al. | |
| 2002/0102766 A1* | 8/2002 | Shibata | H01L 31/1804 257/E21.216 |
| 2007/0209697 A1* | 9/2007 | Karakida | H10F 71/121 257/E31.13 |
| 2008/0128013 A1* | 6/2008 | Lopatin | H10F 77/1698 204/192.1 |
| 2009/0242032 A1* | 10/2009 | Yamazaki | H10F 10/161 257/E21.599 |
| 2011/0308586 A1* | 12/2011 | Yamazaki | H10F 77/211 136/255 |
| 2012/0067423 A1* | 3/2012 | Lochtefeld | H10F 77/1692 257/E31.124 |
| 2015/0214393 A1* | 7/2015 | Hayashida | H10F 10/166 438/98 |
| 2015/0270422 A1* | 9/2015 | Uzu | H10F 19/908 204/192.1 |
| 2016/0284886 A1* | 9/2016 | Han | H03H 9/10 |
| 2017/0104122 A1* | 4/2017 | Moslehi | H10F 71/129 |
| 2018/0122964 A1* | 5/2018 | Adachi | H10F 77/247 |
| 2022/0173264 A1* | 6/2022 | Suzuki | H10F 71/121 |
| 2022/0293802 A1* | 9/2022 | Han | H10F 77/703 |

FOREIGN PATENT DOCUMENTS

| | | | | |
|---|---|---|---|---|
| WO | 2013002662 A1 | 1/2013 | | |
| WO | WO-2015/045263 A1 * | 4/2015 | | H01L 31/056 |

OTHER PUBLICATIONS

Search Report and Written Opinion dated Nov. 26, 2020 in corresponding International Application No. PCT/US2020/049258, 6 pages.

Branham et al. "15.7% Efficient 10-μm-Thick Crystalline Silicon Solar Cells Using Periodic Nanostructures," Adv. Mater., vol. 27, 2015, pp. 2182-2188.

Yu et al. "Light Trapping in Ultrathin Monocrystalline Silicon Solar Cells," Adv. Energy Mater., vol. 3, 2013, pp. 1401-1406.

Jeong et al. "All-back-contact ultra-thin silicon nanocone solar cells with 13.7% power conversion efficiency," Nature Communications, Dec. 16, 2013, 7 pages.

Gaucher et al. "Ultrathin Epitaxial Silicon Solar Cells with Inverted Nanopyramid Arrays for Efficient Light Trapping," Nano Lett., vol. 16, 2016, pp. 5358-5364.

Ishizaka et al. "Progress in thin-film silicon solar cells based on photonic-crystal structures," Jpn. J. Appl. Phys., vol. 57, May 23, 2018, 15 pages.

Yan et al. "Photocurrent enhancement of ultrathin front-textured crystalline silicon solar cells by rear-located periodic silver nanoarrays," Solar Energy, vol. 150, 2017, pp. 156-160.

Li et al. "Quasi-Omnidirectional Ultrathin Silicon Solar Cells Realized by Industrially Compatible Processes," Adv. Electron. Mater., 2019, 7 pages.

Schwinde et al. "New potential for reduction of kerf loss and wire consumption in multi-wire sawing," Solar Energy Materials & Solar Cells, vol. 136, 2015, pp. 44-47.

Solanki et al. "Porous silicon layer transfer processes for solar cells," Solar Energy Materials & Solar Cells, vol. 83, 2004, pp. 101-113.

Saha et al. "Single heterojunction solar cells on exfoliated flexible ~25 μm thick monocrystalline silicon substrates," Appl. Phys. Lett., vol. 102, 2013, 6 pages.

Haschke et al. "Towards wafer quality crystalline silicon thin-film solar cells on glass," Solar Energy Materials & Solar Cells, vol. 128, 2014, pp. 190-197.

"International Technology Roadmap for Photovoltaic (ITRPV) 2018 Results," 10th Edition, Mar. 2019, 80 pages.

Mavrokefalos et al. "Efficient Light Trapping in Inverted Nanopyramid Thin Crystalline Silicon Membranes for Solar Cell Applications," Nano Lett. vol. 12, 2012, pp. 2792-2796.

Han et al. "Symmetry-breaking nanostructures on crystalline silicon for enhanced light trapping in thin film solar cells," Optics Express, vol. 24, No. 26, Dec. 26, 2016, 11 pages.

Vynck et al. "Photon management in two-dimensional disordered media," Nature Materials, vol. 11, Dec. 2012, 6 pages.

Martins et al. "Deterministic quasi-random nanostructures for photon control," Nature Communications, Oct. 24, 2013, 7 pages.

Yablonovitch, Eli, "Statistical ray optics," J. Opt. Soc. Am., vol. 72, No. 7, Jul. 1982, 9 pages.

Campbell et al. "Light trapping properties of pyramidally textured surfaces," J. Appl. Phys., Voly. 62, No. 243, Jul. 1, 1987, 8 pages.

Zhou et al. "Wafer-Scale Integration of Inverted Nanopyramid Arrays for Advanced Light Trapping in Crystalline Silicon Thin Film Solar Cells," Nanoscale Research Letters, 2016, 8 pages.

Singh et al. "Temperature dependence of solar cell performance—an analysis," Solar Energy Materials & Solar Cells, vol. 101, 2012, pp. 36-45.

Siecker et al. "A review of solar photovoltaic systems cooling technologies," Renewable and Sustainable Energy Reviews, vol. 79, 2017, pp. 192-203.

Zhu et al., "Radiative cooling of solar absorbers using a visibly transparent photonic crystal thermal blackbody," PNAS, vol. 112, No. 40, Oct. 6, 2015, 6 pages.

Gentle et al. "Is enhanced radiative cooling of solar cell modules worth pursuing?," Solar Energy Materials & Solar Cells, vol. 150, 2016, pp. 39-42.

Long et al. "Simultaneously enhanced solar absorption and radiative cooling with thin silica micro-grating coatings for silicon solar cells," Solar Energy Materials & Solar Cells, vol. 197, 2019, pp. 19-24.

Han et al. "Toward the Lambertian Limit of Light Trapping in Thin Nanostructured Silicon Solar Cells," Nano Lett., vol. 10, 2010, pp. 4692-4696.

Cai et al. "Effect of symmetry in periodic nanostructures on light trapping in thin film solar cells," Optical Physics, vol. 32, No. 11, Nov. 2015, 7 pages.

Wang et al. "Large-Area Free-Standing Ultrathin Single-Crystal Silicon as Processable Materials," Nano Lett., vol. 13, 2013, pp. 4393-4398.

Nemeth et al. "Polycrystalline silicon passivated tunneling contacts for high efficiency silicon solar cells," J. Mater. Res., vol. 31, No. 6, Mar. 28, 2016, 11 pages.

Rim et al. "An effective light trapping configuration for thin-film solar cells," Appl. Phys. Lett., vol. 91, 2007, 4 pages.

Alden et al. "Radiative cooling by silicone-based coating with randomly distributed microbubble inclusions," Journal of Photonics for Energy, vol. 9, No. 3, Jul.-Sep. 2019, 11 pages.

Palyvos, J.A. "A survey of wind convection coefficient correlations for building envelope energy systems' modeling," Applied Thermal Engineering, vol. 28, 2008, pp. 801-808.

* cited by examiner

FLEXIBILITY-ASSISTED HEAT REMOVAL IN THIN CRYSTALLINE SILICON SOLAR CELLS

RELATED DISCLOSURES

This application is a U.S. National Phase application of PCT/US2020/049258 filed Sep. 3, 2020, which claims priority to U.S. Provisional Patent Application No. 62/895,812 filed Sep. 4, 2019, the entireties of both of which application are incorporated herein by reference.

GOVERNMENT FUNDING

This invention was made with government support under grant/contract number DMR-1555290 awarded by S.E.H., grant/contract number CMMI-1635334 awarded by the S.E.H. and S.M.H., and grant/contract number ECCS-1231046 awarded by S.M.H from the National Science Foundation. The government has certain rights in the invention.

DETAILED DESCRIPTION

Field of the Disclosure

The present disclosure is directed to a flexible, non-flat solar cell and method of increasing the efficiency of the solar cell.

BACKGROUND

Thin crystalline silicon solar photovoltaics have great potential for cost reduction at high efficiency by saving materials. However, efficiency of crystalline silicon solar cells degrades sensitively as they are heated by sunlight. Effective, inexpensive cooling of the solar cells would expedite large-scale adoption of thin silicon photovoltaics in the market.

The solar photovoltaics (PV) market is growing rapidly on a global scale. For the wide distribution of solar PV, current research effort is driven toward enhancing its efficiency and reducing the cost of PV systems. Amongst numerous approaches that have been taken to achieve these goals, one economically viable direction is to use thin (<50 µm) crystalline silicon (c-Si) films. Economic benefit of using thin c-Si films in solar cells is three-fold. First, the processes for thin c-Si film manufacturing minimize material loss. Conventional sawing methods employed to obtain c-Si wafers of a few hundred microns in thickness waste a thickness typically greater than 100 µm per wafer. In contrast, thin c-Si films can be prepared by various loss-minimizing techniques such as epitaxial growth on porous Si, film exfoliation from a c-Si substrate, and liquid phase crystallization of amorphous Si. Second, thin c-Si films reduce the material part of solar module cost. Current c-Si solar cells typically use Si wafers of a 100-300 µm thickness. Because thick c-Si wafers comprise 30-40% of a typical solar module cost, use of thin c-Si films can translate to a substantial reduction in the module cost. Third, thin c-Si films can reduce the cost for handling solar modules. Conventional c-Si solar cells are typically supported on a heavy 3.2-mm-thick glass substrate. In comparison, because thin c-Si solar cells can be flexible, they can be supported on a light-weight platform. The low weight of the thin c-Si solar PV modules would contribute significantly to reducing their transportation and installation cost.

Thin c-Si cells, however, are relatively weak at sunlight absorption and need to be complemented by efficient light-trapping features to enhance photovoltaic efficiency. Much effort has been devoted to developing effective light-trapping structures to improve the efficiency, including periodic, quasi-random, and random structures. While quasi-random, or deterministically random, structures can produce extremely efficient light absorption, they pose great challenges for cost-effective manufacturing. Random structures are currently the most affordable choice in industry. In comparison, periodic structures make the device manufacturing more controllable and provide highly efficient light trapping. Accordingly, various inexpensive, wafer-scale lithography techniques are being developed for fabricating periodic structures on c-Si surfaces. The record efficiency (15.7%) solar cell for a 10-µm-thick c-Si film used a periodic array of nanoscale pyramidal dips, called inverted nanopyramids, on the front surface. Moreover, based on optical experiments, a further efficiency enhancement of 0.9-1.9% has been predicted by breaking the point group symmetry of the inverted nanopyramid array without using expensive off-cut silicon wafers.

Highly absorptive solar cells, however, result in high temperatures under sunlight. High temperatures, in turn, reduce the photovoltaic efficiency. The efficiency degradation by temperature is, in general, more pronounced for lower bandgap materials. Among popular semiconductor materials for solar PV, c-Si has a relatively low bandgap. Consequently, the efficiency of c-Si solar cells is more sensitively affected by temperature than that of solar cells based on higher bandgap materials such as GaAs, CdTe, and CdS.

For cooling solar panels, a variety of technologies exist today, such as radiative cooling, water circulation, water sprinkling, immersion in water, thermoelectric cooling, air circulation, and phase-change materials. However, these technologies increase the manufacturing or operating cost, so that they are not popularly used in commercial products.

SUMMARY

An embodiment of the present disclosure is directed to a flexible, non-flat solar cell. The solar cell comprises a flexible substrate. A pn junction is on or in the flexible substrate. The solar cell has been flexed so as to have a non-flat geometry that results in an increased surface area of the flexed solar cell with respect to the surface area of a flat solar cell that is the same as the flexed solar cell except that the flat solar cell has a flat surface geometry that has the same projected area on a lateral plane as does the flexed solar cell.

An embodiment of the present disclosure is also directed to a method of increasing the efficiency of a solar cell. The method comprises providing a flexible solar cell. The solar cell is flexed so as to provide a non-flat geometry that increases the surface area of the flexed solar cell with respect to the surface area of a flat solar cell that is the same as the flexed solar cell except that the flat solar cell has a flat surface geometry that has the same projected area on a lateral plane as does the flexed solar cell.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates embodiments of the present teachings and together with the description, serve to explain the principles of the present teachings.

FIG. 3 shows data supporting efficiency enhancement in thin c-Si solar cells by breaking nanostructure symmetry. In particular.

FIG. 4 illustrates the flexibility of thin c-Si solar cells. In particular.

FIGS. 6A and 6B show the efficiency enhancement of a wavy solar cell by cooling.

FIG. 7A shows a predicted temperature of an example 14-μm-thick c-Si solar cell with the $C_2$ symmetry light-trapping structure as a function of the area enhancement factor for various heat transfer coefficient values at an ambient temperature of 25° C. FIG. 7B shows efficiency of the example 14-μm-thick c-Si solar cell with the $C_2$ symmetry light-trapping structure as a function of the area enhancement factor for various heat transfer coefficient values at an ambient temperature of 25° C.

It should be noted that some details of the figure have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawings that form a part thereof, and in which is shown by way of illustration specific exemplary embodiments in which the present teachings may be practiced. The following description is, therefore, merely exemplary.

In the present disclosure, a new solar cell cooling possibility has been conceived that exploits the great flexibility of thin films to increase the efficiency of solar cells. For example, consider that a rooftop has a fixed area and the maximum electric power generation is desired from the area. Flexible solar cells can be shaped in a variety of 3-dimensional forms to generate a greater electric power than flat PV modules. Moreover, these shaped forms have a larger surface area than a flat sheet, so that heat is more efficiently removed from the solar PV modules to the ambient air. Because of a high temperature sensitivity of c-Si PV modules, the 3-dimensional shaping would be highly beneficial for solar cells comprising thin c-Si substrates, as well as substrates comprising other low bandgap materials.

Figure 1:
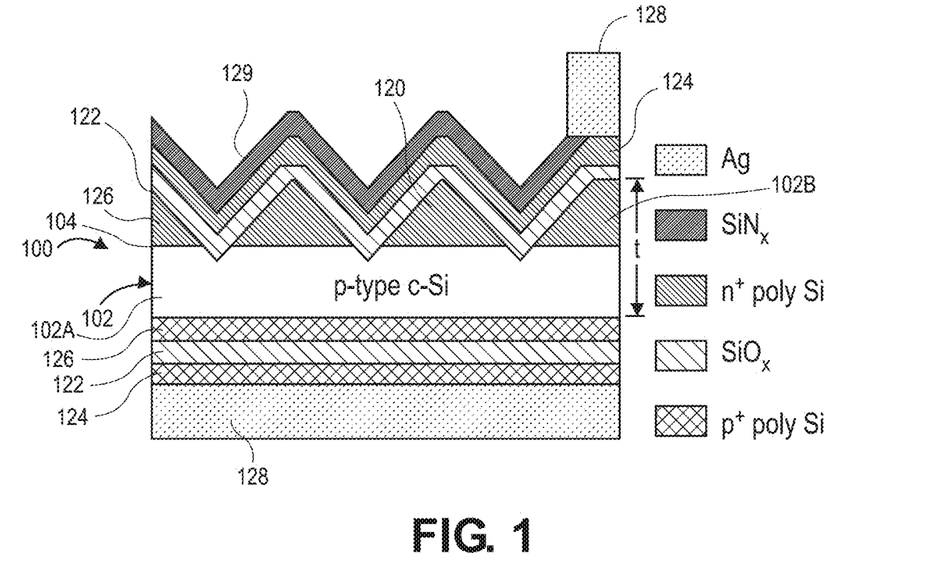
FIG. 1 shows a schematic, cross-sectional view of a solar cell device, according to an embodiment of the present disclosure.
Figure 2A:
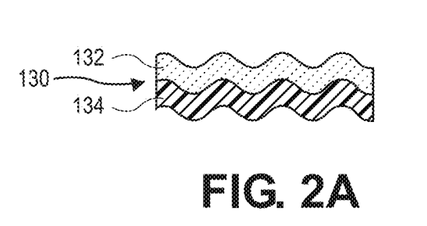
FIGS. 2A to 2D illustrate a process for shaping thin c-Si solar cells into a wavy film using a template, followed by the solar cells being glued on a wavy Al film by an adhesive, according to an example of the present disclosure.
Figure 2B:
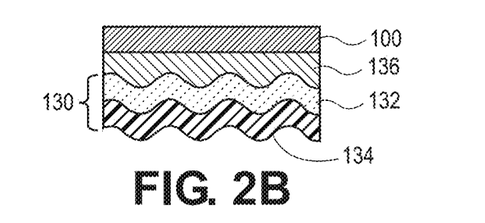

An embodiment of the present disclosure is directed to a flexible, non-flat solar cell. Referring to FIG. 1, a solar cell 100 comprises a flexible substrate 102. A pn junction 104 is on or in the flexible substrate 102. As shown in FIG. 2D, the solar cell 100 can be flexed so as to have a non-flat geometry that results in an increased surface area of the flexed solar cell with respect to the surface area of a flat solar cell that is the same as the flexed solar cell except that the flat solar cell has a flat surface geometry that has the same projected area on a lateral plane as does the flexed solar cell.

Any substrate 102 suitable for solar cells that has a desired degree of flexibility can be employed. In an embodiment, the substrate 102 comprises crystalline silicon. In an embodiment, the substrate comprises both a p-type c-Si layer 102A and n+ poly silicon region 102B. In other examples, substrate 102 comprises materials selected from Group IV materials, such as silicon or germanium; group Group III-V materials, such as GaAs, GaInAs and GaN, as well as other semiconductor materials.

The substrate 102 comprises a pn junction 104. Any suitable method for forming the pn junction 104 either on or in the flexible substrate 102 can be employed. Suitable methods for forming a pn junction both on or in substrates are generally well known in the art.

In an example, the substrate 102 is freestanding (e.g., is self-supported rather than being supported by another substrate) prior to being adhered to a support substrate, or optionally remains freestanding (e.g., during use). In an embodiment, the substrate 102 has a thickness, t, of less than about 25 microns, such as about 0.5 microns to about 20 microns, or about 1 micron to about 15 microns, or about 8 microns to about 15 microns.

The solar cell 100 can be flexed to form any non-flat shape so as to increase surface area. For example, the flexible, non-flat solar cell 100 can have a wave shape, as shown in FIG. 2D. As examples, the average amplitude of the wave can be greater than 0.5 millimeters (mm), such as 0.5 mm to 1 meter, or about 1 mm to about 100 cm or about 2 mm to about 10 cm, or about 5 mm to about 5 cm. In an embodiment, the flexible, non-flat solar cell has a surface area (Sw) that is larger than the projected area (So) of the solar cell on its lateral plane by a factor of Sw/So of 1.1 or greater, such as 1.2 to about 10, or 1.2 to about 5 or 1.2 to about 3 or 1.2 to about 2, or 1.2 to about 1.5.

The increased surface area provides for an increased rate of heat removal. This can result in lower solar cell temperatures and, in turn, increased efficiency of the solar cell compared to a flat solar cell covering the same area. Thus, the larger surface area Sw allows heat to be more efficiently removed from the solar cell to the ambient air than if the solar cell were flat and had an area So.

Figure 3A:
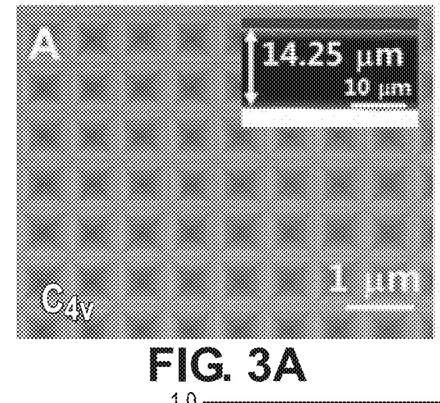
FIG. 3A shows a scanning electron micrograph of a top view of a $C_{4v}$ symmetry inverted nanopyramid array on about 14-μm-thick c-Si films.
Figure 3B:
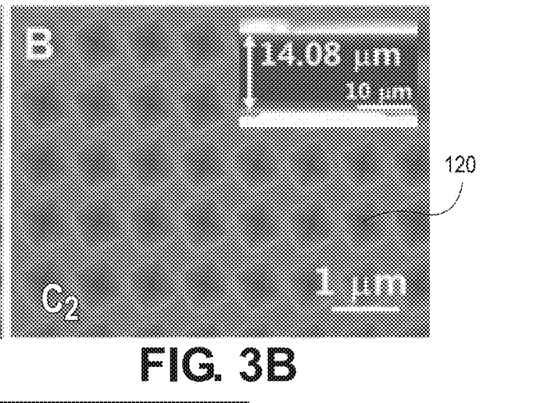
FIG. 3B shows a scanning electron micrograph of a top view of a $C_2$ symmetry inverted nanopyramid array on about a 14-μm-thick c-Si film.

In an embodiment, the solar cell is configured to enhance photovoltaic efficiency by both the flexibility-assisted heat removal discussed above, as well as by light trapping. To enhance light trapping, symmetry breaking nanostructures can be employed, such as an inverted nanopyramid array 120 with a low amount of symmetry. Other light trapping nanostructures could also potentially be employed. The symmetry of the symmetry breaking nanostructures can be lower than $C_{4V}$, such as $C_2$ symmetry or lower, as illustrated by the $C_2$ symmetry structure of FIG. 3B. Methods for forming the inverted nanopyramid array structures having C2 symmetry are described, for example, in U.S. Pat. No. 10,483,415, and the paper published by S. J. Han et al., Symmetry-breaking nanostructures on crystalline silicon for enhanced light trapping in thin film solar cells, *Opt. Express* 24, A1586-A1596 (2016), the disclosures of both of which are incorporated herein by reference in their entireties. Structures with symmetries of $C_{4V}$ or higher can also be used, although such structures would not provide the efficiency benefits of the lower symmetry structures.

A method of making the solar cell 100 is illustrated in the examples below. Other suitable methods of making the solar cell could be employed, as would be understood by one of ordinary skill in the art.

The present disclosure is also directed to a method of increasing the efficiency of a solar cell. As illustrated in FIGS. 2A to 2D, the method comprises providing a flexible solar cell 100. The solar cell 100 is flexed so as to provide a non-flat geometry that increases the surface area of the flexed solar cell with respect to the surface area of a flat solar cell that is the same as the flexed solar cell except that the flat solar cell has a flat surface geometry that has the same projected area on a lateral plane as does the flexed solar cell.

In an embodiment, the method comprises adhering the flexible solar cell to the surface of a support substrate, where the surface of the support substrate has the non-flat geometry. An example of such a support substrate 130 is illustrated in FIG. 2A. Support substrate 130 comprises a conductive layer 132 comprising any suitable conductive material, such as aluminum or another metal. Substrate 130 can also optionally comprise a template 134 having the desired shape (e.g., wavy). Template 134 can comprise any suitable material, such as a polymer.

The solar cell 100 can be attached to the support substrate 130, such as by using an adhesive 136. Any suitable adhesive can be employed, such as Ethylene-vinyl acetate ("EVA"). Any of the flexible substrates described herein, including the substrate materials and/or substrate thickness, can be employed. In an embodiment, the substrate 102 of solar cell 100 is freestanding prior to being adhered to the support substrate 130.

In an embodiment, the solar cell 100 comprises a flexible substrate 102 (FIG. 1) having symmetry breaking nanostructures, such as a plurality of inverted nanopyramid arrays 120, as described above. The formation of the inverted nanopyramid arrays 120 can be carried out by an etching process prior to flexing. Etching techniques for forming inverted nanopyramid arrays are generally well known in the art.

Figure 2C:
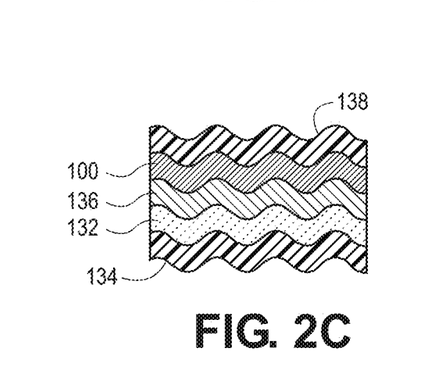
Figure 2D:
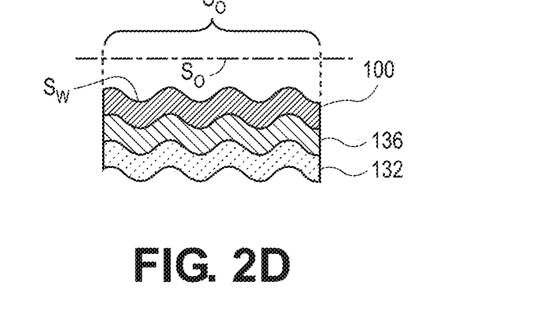

Referring to FIG. 2C, the solar cell 100 is flexed to form the desired shape. For example, the solar cell 100 can be conformed to the underlying shape of the support substrate 130 by employing a second template 138 having a shape similar to that of template 134. The second template 138 can be aligned with the template 134 and a force applied thereto in order to press down on, and flex, the solar cell 100 into the desired shape. In an embodiment, the solar cell 100 is flexed so that after flexing the solar cell 100 has a wave shape, such as a wave shape with any of the average amplitudes described herein. After flexing, the flexible solar cell has a surface area (Sw) larger than the projected area (So) on its lateral plane by a factor of Sw/So of 1.1 or greater, such as 1.2 to about 10, or 1.2 to about 5 or 1.2 to about 3 or 1.2 to about 2, or 1.2 to about 1.5.

Following the flexing of the substrate 102, one or both of the templates 134, 138 are removed, leaving the structure as shown, for example, in FIG. 2D.

The flexible solar cell employed in the methods of the present disclosure can have any configurations described herein, such as, for example, that illustrated in FIG. 1. In embodiments, the solar cell is configured to enhance photovoltaic efficiency by both light trapping and flexibility-assisted heat removal, as has been described herein above.

EXAMPLES

Thin free-standing flexible c-Si solar cells of a 10-14 μm thickness were fabricated and their photovoltaic efficiency enhanced by both light trapping and flexibility-assisted heat removal. To further enhance light trapping in inverted nanopyramid arrays, a cost-effective method of breaking symmetry in the structure was employed. For heat removal, the thin c-Si cells were shaped in a wavy form. From the experiment, the effect of the cell surface area on heat removal and the resulting photovoltaic efficiency was determined.

Example 1: Symmetry Breaking Effect

Symmetry breaking can enhance the overall absorptance of solar cells by increasing the number of resonant absorption peaks within the solar spectrum. To experimentally determine the symmetry-breaking effect on photovoltaic efficiency, 14-μm-thick free-standing c-Si cells were fabricated with inverted nanopyramid arrays of $C_{4v}$ (FIG. 3A) and $C_2$ (FIG. 3B) symmetries on the front surface of the cells. Thin c-Si films (corresponding to flexible substrate 102 of FIG. 1) were prepared by etching 250-μm-thick p-type c-Si(100) wafers in a potassium hydroxide (KOH) solution. The inverted nanopyramid arrays 120 were fabricated by interference lithography followed by etching in a KOH solution. This technique is valid for single crystalline Si wafers, but not for polycrystalline Si wafers. Symmetry breaking was achieved by rotating a $C_{2v}$ symmetry etch mask about the c-Si [001] axis such that a lattice vector in the mask is tilted from the [110] direction by 22.5°, and then etching as described in the examples below and in S. J. Han et al., Symmetry-breaking nanostructures on crystalline silicon for enhanced light trapping in thin film solar cells, *Opt. Express* 24, A1586-A1596 (2016), the disclosure of which is incorporated herein by reference in its entirety. After the light-trapping structures were fabricated, a pn-junction was made using an n-type spin-on-dopant (P-1200, Desert Silicon) near the structured front surface. Boron was infiltrated near the back surface using a p-type spin-on-dopant (B-200, Desert Silicon). Then, tunneling $SiO_x$ layers 122 were thermally grown on both front and back surfaces at a thickness of 1-2 nm. Intrinsic amorphous Si was deposited on the $SiO_x$ layers and subsequently turned into polycrystalline Si (poly- Si) 124 by heating at 950° C. for 3 hours. During the heating process, the dopants diffused into the poly-Si through the tunneling oxide layers, forming highly doped poly-Si 126. Metal contacts 128 were deposited by electron beam evaporation on the highly doped poly-Si. The poly-Si films, each of which was 80-nm-thick, on the tunneling $SiO_x$ layers formed passivated contacts. After fabricating metal contacts, an 80-nm-thick $SiN_x$ antireflection layer (corresponding to an antireflection layer 129 of FIG. 1) of a refractive index 1.9 was deposited on the front surface. A schematic cross-section of the structure is shown in FIG. 1. Additional details of the fabrication processes are described in the examples below.

The $C_{4v}$ symmetry structure (FIG. 3A) with a unit cell size of 700 nm×700 nm has a four-fold rotation symmetry axis and four mirror-symmetry planes. In comparison, the $C_2$ symmetry structure (FIG. 3B) has a unit cell size of 800 nm×900 nm, characterized by a two-fold rotation symmetry axis and the absence of mirror symmetry. In both structures, the sides of the base of the inverted nanopyramids correspond to a [110] direction. Some parts of the (100) plane remain unetched, leaving flat areas. Further etching can remove the flat areas and, in this case, overall light absorptance increases.

Figure 3C:
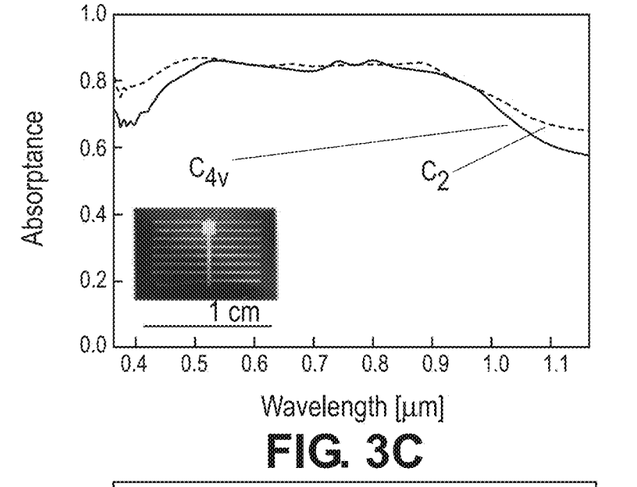
FIG. 3C shows absorptance spectra of the two solar cells made using the arrays of FIGS. 3A and 3B with the nanostructures of different symmetry.

FIG. 3C compares absorptance spectra of the two cells approximately above the bandgap of c-Si, which corresponds to $\lambda \lesssim 1.1$ μm. The symmetry breaking from $C_{4v}$ to $C_2$ increases absorptance both in the short and long wavelengths in the measured spectrum. The absorptance spectra in FIG. 3C can vary depending on a number of factors. For instance, the absorptance for $\lambda \lesssim 0.8$ μm is lower than if no top metal electrode were present because the top metal electrode covers ~10% of the c-Si surface, thereby reducing the amount of light incident on the light absorbing layers. For $\lambda \gtrsim 0.96$ μm, absorptance is higher than that monocrystalline Si were used in place of the poly-Si layers because the poly-Si layers (FIG. 1) have a higher absorption coefficient than monocrstalline Si and absorption in the poly-Si is significantly enhanced by the light-trapping structures.

Figure 3D:
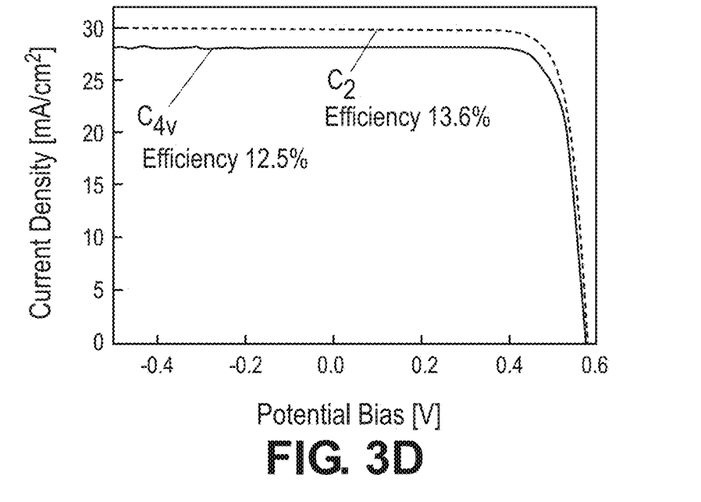
FIG. 3D shows IV characteristics of the two solar cells made using the arrays of FIGS. 3A and 3B.

The current-voltage (IV) characteristics of the cells with the different symmetry nanostructures are shown in FIG. 3D. Because of the increased absorptance by symmetry breaking, the short circuit current density $J_{sc}$ of the $C_2$ symmetry structure (29.9 mA/cm$^2$) is higher than that of the $C_{4v}$ symmetry structure (28.2 mA/cm$^2$) by 1.7 mA/cm$^2$, which corresponds to an enhancement of 6%. The open circuit voltage $V_{oc}$ and the fill factor FF of the two cells are the same at 0.58 V and 0.78, respectively. The IV characteristics give efficiencies of 12.5% and 13.6% for the $C_{4v}$ and $C_2$ symmetry structures, respectively. The efficiency enhancement due to the symmetry breaking was about 1.1%.

Example 2: Shaping Flexible Substrates

Figure 4:
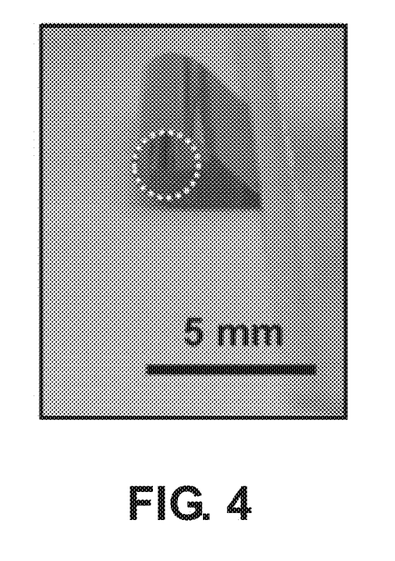
FIG. 4 shows an image of a 14-μm-thick c-Si film bent with a radius of curvature less than 1 mm, according to an example of the present disclosure.

Freestanding thin c-Si films are capable of being shaped in a variety of forms due to their high flexibility. For illustration, FIG. 4 shows a 14-μm-thick c-Si film that is bent with a radius of curvature down to less than 1 mm. Using the high flexibility, thin c-Si cells were shaped into a wavy form using polymer templates. For the shaping, a 38-μm-thick aluminum (Al) film was pressed between two polymer templates with wavy surfaces. After removing the top polymer template, the conformally shaped Al film (corresponding to conductive layer 132 in FIG. 2A) remained on the bottom template 134 (FIG. 2A). Ethylene-vinyl acetate (EVA) (corresponding to adhesive 136) was placed on the Al film and heated at 130° C. to be melted and a thin c-Si cell (corresponding to solar cell 100 of FIG. 2B) was placed on the EVA. Then, the top polymer template (corresponding to template 138), which had previously been used to shape the Al film, was pressed onto the c-Si cell, similarly as shown for solar cell 100 in FIG. 2C. The composite layers of templates, cell, EVA, and Al were cooled in the pressed state and the EVA was solidified. The two templates were subsequently removed to leave the cell glued on the Al film shaped into a wavy form of a periodicity of 4.8 mm. Surface area of the wavy structure was ~20% greater than the projected area on the lateral plane. Macroscopic shaping of solar cells can be carefully designed to enhance light trapping.

Figure 5A:
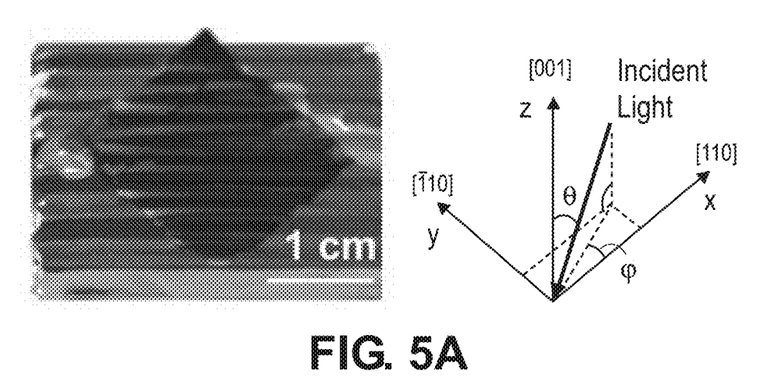
FIG. 5A shows an image of a 9.5-μm-thick wavy solar cell with the $C_2$ symmetry light-trapping structure, according to an example of the present disclosure. Top metal contact is absent and the solar cell is glued on an Al film (left). The solar cell orientation and incident light direction are shown in the graph (right).
Figure 5B:
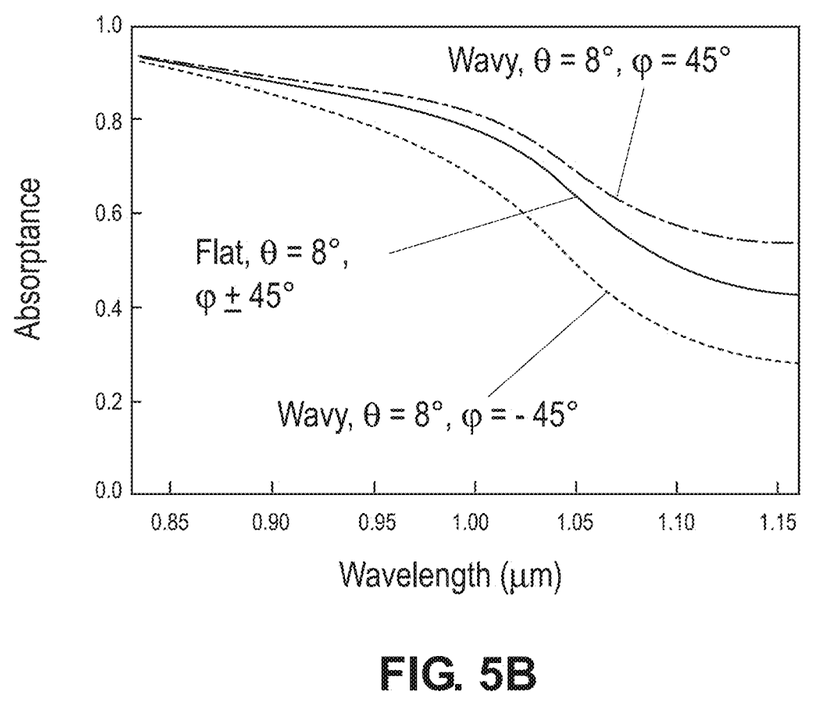
FIG. 5B shows absorptance spectra of the solar cell in FIG. 5A before and after being shaped into the wavy film.

A 9.5-μm-thick flat c-Si cell was fabricated with the $C_2$ symmetry light-trapping structure and its IR absorptance spectra were measured at an incident polar angle of about θ=8° and azimuthal angles of about φ=±45° with the angles defined in FIG. 5A. The cell structure was the same as FIG. 1 except that the top metal contact was absent. Then, the cell was shaped in a wavy film and the same absorptance measurement was performed on the wavy cell. The wave was periodic in the approximately diagonal direction of the cell. FIG. 5B compares the IR absorptance spectra of the cell before and after the shaping. While the polar angle θ=8° is small, absorptance of the wavy cell showed a pronounced dependence on the azimuthal angle. Absorptance of the wavy cell was higher and lower than the flat cell at about φ=45° and −45°, respectively. By controlling the cell orientation with respect to the wave direction, the overall absorptance could be maximized for practical applications.

Example 3: Effects of Macroscopic Solar Cell Shape on Heat Removal

Figure 6A:
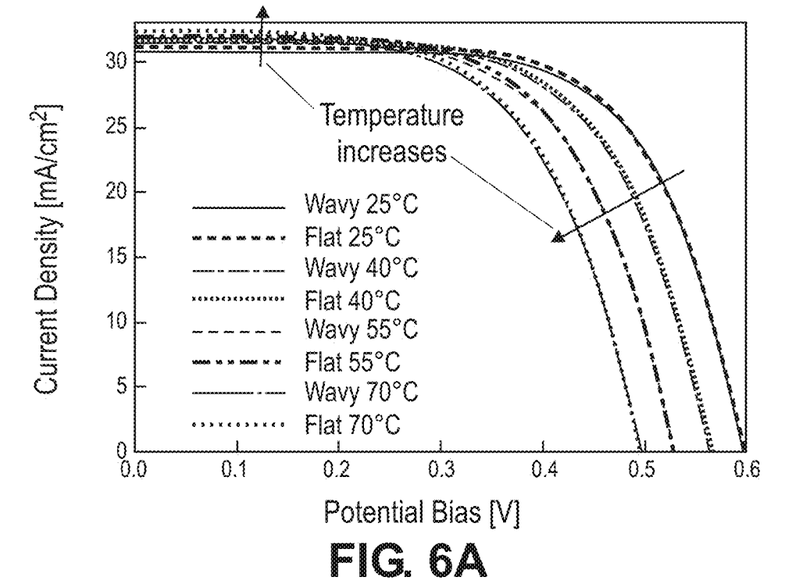
FIG. 6A shows the temperature dependence of the current-voltage ("IV") characteristics of an example 14-μm-thick c-Si solar cell with the $C_2$ symmetry light-trapping structure in both flat and wavy forms, according to example of the present disclosure.

To investigate the effect of the wavy form on the photovoltaic properties and heat removal, a 14-μm-thick c-Si cell was fabricated with metal contacts and the $C_2$ symmetry light-trapping structure on the front surface. This cell gave an efficiency of 12.4%, which is lower than the efficiency 13.6% of the cell with the $C_2$ symmetry structure in FIG. 3D, even though the cell thickness was the same. The lower efficiency may be due to some defects that were clearly visible. Because the temperature dependence of IV characteristics for thin c-Si cells can be different from that for conventional thick cells, the IV characteristics of the thin cell were directly obtained by varying the cell temperature from 25° C. to 70° C. as shown in FIG. 6A. After the photovoltaic properties of the flat cell were characterized as a function of temperature, the same cell was shaped in a wavy film and the photovoltaic characterization was performed on the wavy cell. When the temperature was lowered back to 25° C. after heating, the IV curve returned to the original one.

At room temperature, the $J_{sc}$ in the wavy form (30.8 mA/cm$^2$) was lower than that in the flat form (31.3 mA/cm$^2$) by 1.6% (FIG. 6A), indicating that the wavy shaping slightly decreased light absorption in the normal direction. The $V_{oc}$ and FF were negligibly affected by the wavy shape. As a result, the photovoltaic efficiency η in the wavy form (12.3%) was slightly lower than that in the flat form (12.4%) at room temperature.

Figure 6B:
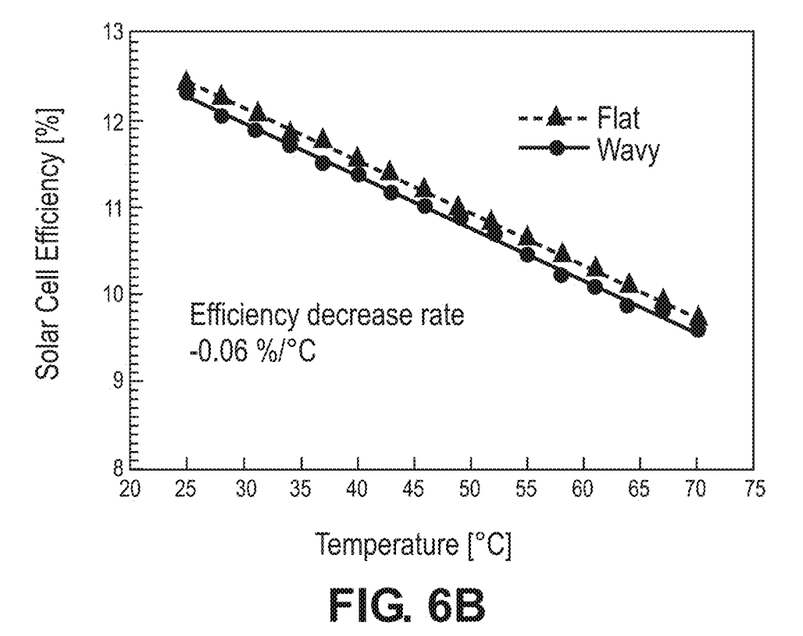
FIG. 6B shows the temperature dependence of the photovoltaic efficiency of an example 14-μm-thick c-Si solar cell with the $C_2$ symmetry light-trapping structure in both flat and wavy forms, according to an example of the present disclosure.

As the temperature increases over our range of measurement, $V_{oc}$ decreases significantly and $J_{sc}$ increases slightly in both flat and wavy forms. From the IV curves in FIG. 6A, temperature dependence of the photovoltaic efficiency was obtained, as shown in FIG. 6B. In both flat and wavy forms, as the temperature increased, the efficiency decreased at a rate of −0.06%/° C., which is equivalent to (dη/dT)/η=−0.0048 to −0.0062/° C. This rate for the thin cell is similar to that for conventional thick cells. The efficiency of the cell was slightly higher in the flat form than in the wavy form by ~0.2% at each temperature due to a higher $J_{sc}$.

The wavy cell had a surface area ($S_w$) larger than the projected area ($S_0$) on its lateral plane by a factor of $\alpha \equiv S_w/S_0 = 1.2$. The increased surface area would enhance heat removal from the cell when it is heated by sunlight. The relation between a and the cell temperature can be found from a heat balance. Consider that a flat cell and a wavy cell are exposed to a solar flux Q and the heat transfer from the cells to the ambient air is assumed to be described by a heat transfer coefficient h. The flat cell area is assumed to be the same as the projected area of the wavy cell on the lateral plane ($S_0$). Efficiencies of the flat ($\eta_f$) and wavy ($\eta_w$) cells depend on their temperatures $T_f$ and $T_w$, respectively. Solar average absorptance of the flat and wavy cells is $A_f$ and $A_w$, respectively. When radiative heat transfer through mid-IR is negligible, heat balance for the flat and wavy cells gives $$2h(T_f-T_a)=[A_f-\eta_f(T_f)]Q \quad (1)$$

$$2h\alpha(T_w-T_a)=[A_w-\eta_w(T_w)]Q, \quad (2)$$

where $T_a$ is the ambient temperature. The factor of 2 on the left hand side of Eqs. (1) and (2) accounts for the top and bottom surfaces. From Eqs. (1) and (2), the ratio of the cell temperature differences from $T_a$ between the flat and wavy cells is obtained as $$\frac{T_f - T_a}{T_w - T_a} = \left[\frac{A_f - \eta_f(T_f)}{A_w - \eta_w(T_w)}\right]\alpha. \quad (3)$$

If absorptance and efficiency of the flat cell are similar to those of the wavy cell, Eq. (3) becomes $$\frac{T_f - T_a}{T_w - T_a} \cong \alpha > 1. \quad (4)$$

Accordingly, the wavy cell would be at a lower temperature than that of the flat cell. The lower temperature of the wavy cell would, in turn, lead to an efficiency gain.

To quantitatively assess the effect of the wavy form on the temperature and efficiency of the cell, a flat cell was fabricated that was identical to the wavy cell except for its flatness, as a reference. The temperatures of the flat and wavy cells were measured under sunlight. The wavy cell was the same one that produced the results in FIGS. 6A and B. The measurement was performed on Jul. 9 and 21, 2019 in Albuquerque under a clear sky. The cells were placed 15-17 mm above a polyethylene (PE) film with four pieces of spacers made of Styrofoam on the cell edges and were located ~1 m above the ground. Side walls were set up in the measurement system with a PE film to minimize the effect of time-varying wind speeds on the cell temperature. In addition to the wind-blocking side walls, the wind speed was relatively low (~3 miles per hour) on the both dates of the experiments. Due to the low wind speed, the top of the measurement system was safely open, which allowed us to accurately measure the cell temperature with an IR camera from above. The cell temperature was obtained by calibrating the IR camera readings and represented by an average over 6 different points over the cell. The cells were tilted from the horizontal plane by 12° to face the sunlight in the normal direction. When the cell temperatures were measured at 1:30 pm, the zenith angle was 12°, the solar intensity was measured to be 1044 W/m², and the ambient temperature was 31° C. on the both dates. The measurements were performed with the cells at open circuit condition.

In the experiment on Jul. 9, 2019, the cells were on Al films and some parts of the Al surfaces were not covered by the cells. The exposed Al parts were not cut because the cutting might have broken the cells if not carefully done. The temperatures of the flat and wavy cells were 54° C. and 49° C., respectively, so that the wavy cell was at 5° C. below the flat cell temperature. On Jul. 21, 2019, the same experiment was performed by painting the exposed Al surfaces black. The black paint increased the cell temperature in comparison with the Al surfaces, resulting in the flat and wavy cell temperatures of 69.7° C. and 64° C., respectively. Thus, the wavy form of the cell decreased the cell temperature by 5.7° C. in the presence of the black paint.

The cell temperatures would have been different from the measurements if the exposed Al or black surfaces had been absent. To estimate the cell temperatures in this case, a value for h was obtained from the experiments. For our experiments, heat balance for the flat and wavy cells gives $$2h(T_f-T_a)=<A_f>Q \quad (5)$$

$$2h\alpha(T_w-T_a)=<A_w>Q, \quad (6)$$

where < > denotes an average over the area that includes both the cell and the exposed Al or black paint. Note that, in Eqs. (5) and (6), η is absent unlike Eqs. (1) and (2) because open circuit condition is considered. From Eqs. (5) and (6), it was found that h=10.7 W/(m²K) and 10.2 W/(m²K) on the July 9$^{th}$ and 21$^{st}$, respectively. These values are modestly higher than h~8 W/(m²K) for natural convection. When the exposed Al or black surfaces were absent, the cell temperatures were determined by replacing $<A_f>$ and $<A_w>$ by $A_f$ and $A_w$ in Eqs. (5) and (6), respectively. At open circuit condition without exposed Al or black paint, it was found that $T_f$=63.9° C. and $T_w$=58.0° C. for the July 9$^{th}$ experiment and that $T_f$=65.6° C. and $T_w$=59.3° C. for the July 21$^{st}$ experiment. On average, the temperature difference was $T_f-T_w$=6.1° C. at open circuit condition.

If electric power is generated by the cells, the cell temperatures would be lower than those at open circuit condition. Substituting $\eta_f(T_f)$ and $\eta_w(T_w)$ obtained from FIG. 6B in Eqs. (1) and (2), at the maximum power generation condition, it can be found that $T_f$=58.8° C. and $T_w$=53.7° C. for the July 9$^{th}$ experiment and that $T_f$=60.3° C. and $T_w$=54.9° C. for the July 21$^{st}$ experiment. The average temperature difference was $T_f-T_w$=5.3° C. The average efficiencies were obtained as $\eta_f(T_f)$=10.4% and $\eta_w(T_w)$=10.5%. Therefore, it is estimated that when the cell is shaped in the wavy form, the photovoltaic efficiency increases by 0.1% by reducing the cell temperature by 5.3° C.

Figure 7:
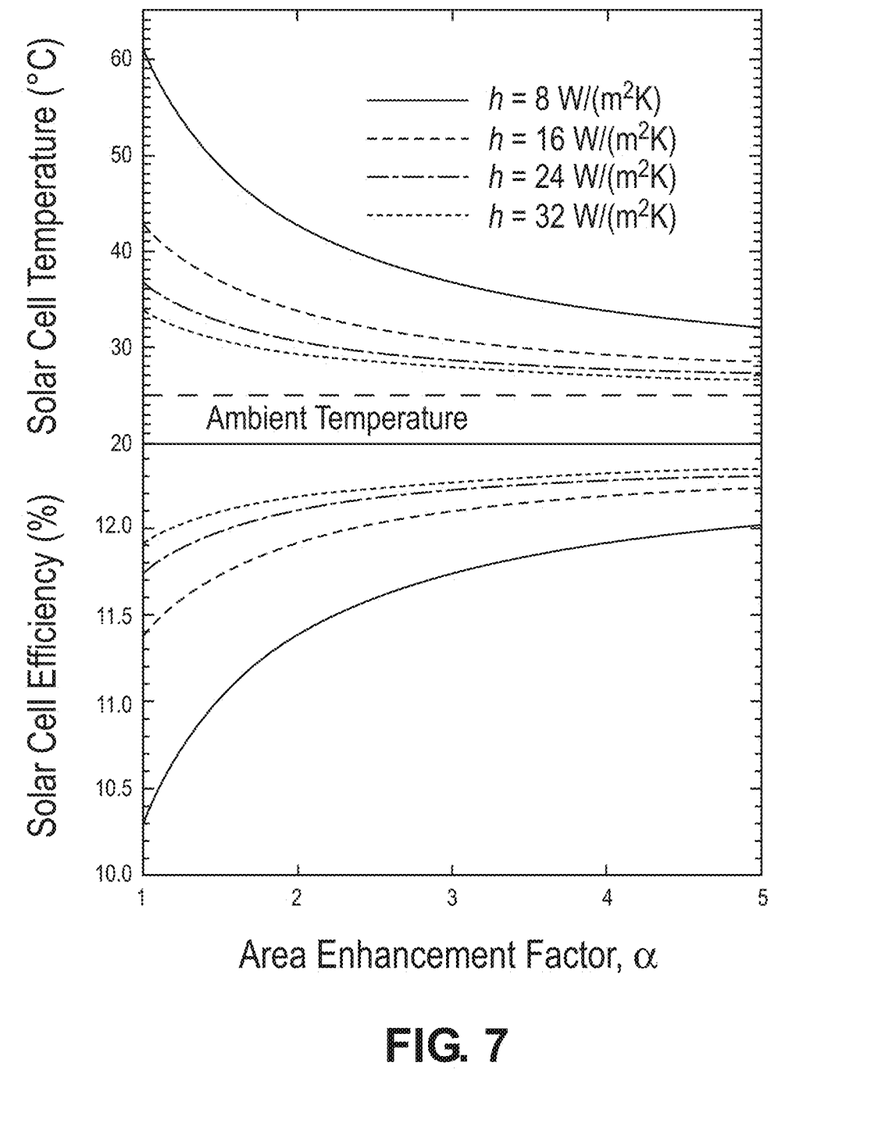
FIG. 7 shows efficiency enhancement and cooling of thin c-Si solar cells by surface area enhancement. In particular.

Using Eq. (1) and FIG. 6B, it is predicted that the temperature and efficiency of the 14-μm-thick c-Si cell at the maximum electric power generation condition as the area enhancement factor α of the cell changes by shaping in a non-flat form. It can be assumed that the cell absorptance remains constant as a varies and the heat transfer coefficient is independent of the cell geometry. FIGS. 7A and 7B show predictions for the AM1.5G solar spectrum when the ambient temperature is 25° C. As a increases from 1 to 5, the cell temperature decreases by 28.9° C. at h=8 W/(m²K) (FIG. 7A). As a result, the efficiency increases significantly by 1.7% from 10.3% to 12.0% (FIG. 7B). The temperature drop and the efficiency enhancement become less pronounced as h increases. However, even at h=32 W/(m²K), which corresponds to a moderately high wind speed (~7 m/s), the efficiency increases by a non-negligible amount of 0.4% as α increases from 1 to 5. Note that, by increasing α from 1 to 5 at h=8 W/(m²K), there is an even greater efficiency than by increasing h from 8 W/(m²K) to 32 W/(m²K) at α=1 (FIG. 7B). Therefore, increasing the cell surface area by 5 times in a non-flat shape is equivalent to increasing the wind speed by ~7 m/s in terms of the efficiency gain.

The above study indicates that thin c-Si solar modules can be shaped in numerous non-flat forms, assisted by their flexibility, and can be effectively cooled without extra cooling equipment or materials simply by an enhanced surface area. In general, the capability of thin c-Si solar cells in increasing their efficiency by effective and inexpensive heat removal may push the current configuration of photovoltaic systems into a radically different one.

Example 4: Free-Standing Thin c-Si Film Preparation

Free-standing thin (10-14 µm) c-Si films were prepared by etching 4-inch double-side-polished 250-µm-thick wafers in a KOH solution. The thick c-Si(100) float-zone p-type wafers were boron-doped and had a resistivity of 1-3 Ωcm. Etching of the wafers was performed in a semiconductor-grade KOH solution of 50 wt % at 90° C. To prevent contamination during etching, clean quartz wares were used for beakers and wafer holders. At the etching conditions, the wafer thinning rate was measured to be ~60 µm/hour/side.

To achieve uniform etching over a wafer, temperature gradient in the KOH solution was minimized by stirring the solution during etching. As hydrogen bubbles were vigorously generated as an etch byproduct, strong convective flows occurred in the solution, which would help maintaining etch uniformity. Thickness variation over a 4-inch wafer was negligible after thinning. Mirror-like clear surfaces without noticeable haze in the wafer were preserved after thinning. Surface profiling (Dektak 3, Veeco) revealed that local surface roughness increased from <10 nm to 20-60 nm by wafer thinning. The surface roughness of the thinned wafers was sufficiently small for patterning with interference lithography (IL) that used a wavelength of 355 nm.

The free-standing thin c-Si films had to be handled carefully to avoid breakage. However, at a thickness of 10-14 µm, the c-Si films were able to be processed by solar cell fabrication steps, as described herein.

Example 5: Light-Trapping Structure Fabrication

Light-trapping structures of $C_{4v}$ and $C_2$ symmetry inverted nanopyramid arrays were fabricated on the thin c-Si films by interference lithography (IL) and KOH etching. For IL, a silicon nitride ($SiN_x$), an antireflection coating, and a photoresist were deposited in series on the thin c-Si films. The $SiN_x$ layer was deposited by plasma enhanced chemical vapor deposition (PECVD) at a thickness of 30 nm and a refractive index of 1.9 at 633 nm. In the PECVD, the ratio of volumetric flow rate between a diluted silane gas (5 vol % $SiH_4$ in Ar) and a pure ammonia gas was 4.0, and a deposition pressure was 1000 mTorr. The antireflection layer (iCON-16, Brewer Science) was spin-coated at a thickness of 160 nm. Then, a 500-nm-thick negative photoresist (NR7-500P, Futurrex) was spin-coated as a top layer. The photoresist layer was preheated for soft baking (150° C., 60 seconds), patterned in Lloyd's mirror interferometry with a 355-nm YAG-Nd laser (Infinity 40-100, Coherent Inc.), and post-baked (100° C., 60 seconds). After the photoresist was developed, reactive ion etching was performed with $O_2$ and $CHF_3/O_2$ for etching the antireflection and $SiN_x$ layers, respectively, to expose the c-Si surfaces through the etch windows. The exposed surfaces were anisotropically etched in a 20 wt % KOH solution at 50° C. for 10 minutes. In the solution, the photoresist and antireflection layers were delaminated, and inverted nanopyramids were etched into the c-Si surfaces with the $SiN_x$ as an etch mask. The $SiN_x$ was subsequently removed in a buffered oxide etch solution.

Example 6: Thin c-Si Solar Cell Fabrication

Figure 8:
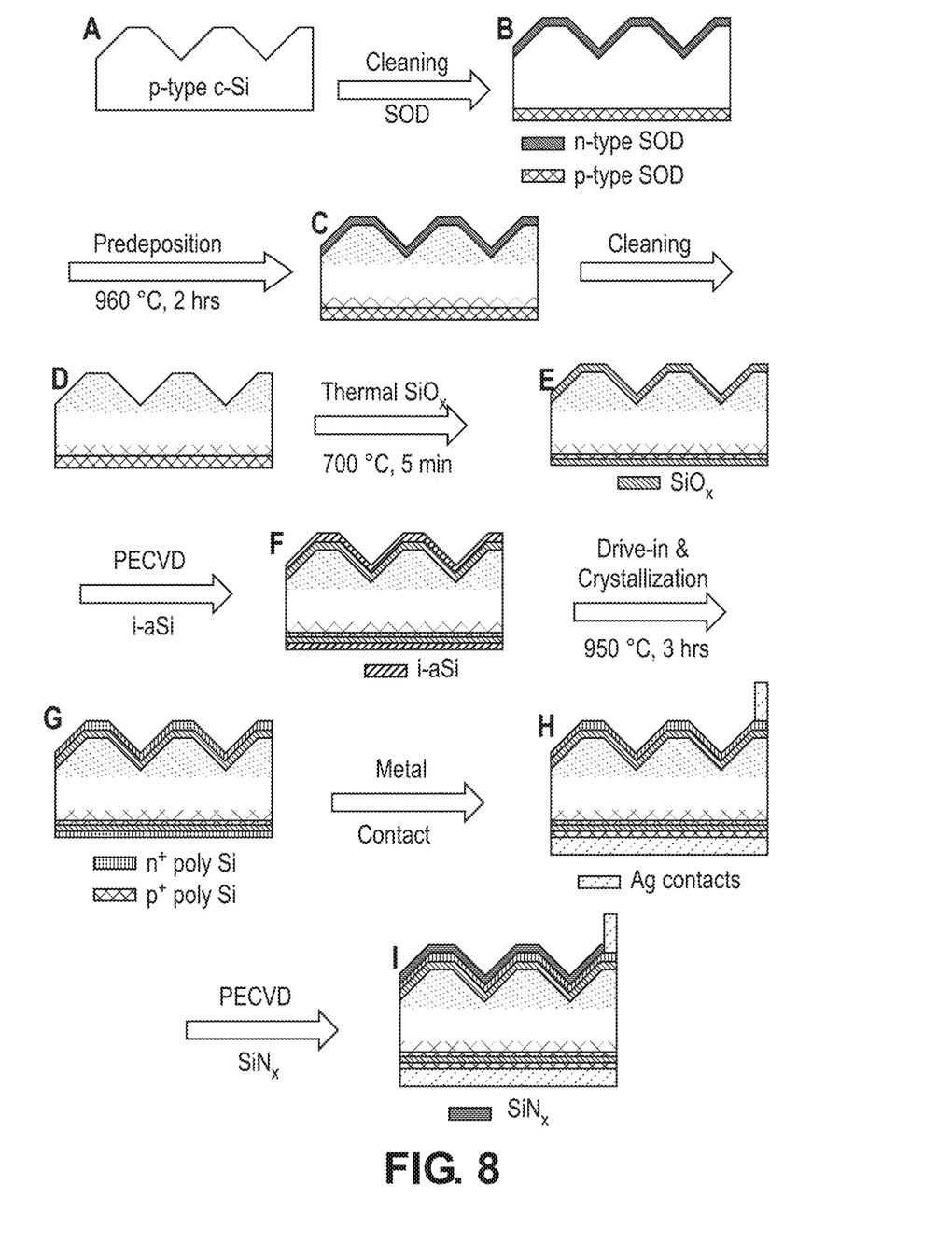
FIG. 8 shows a diagram of an example thin solar cell fabrication process, according to an example of the present disclosure.

An example of a thin solar cell fabrication process is summarized in FIG. 8. Such a process could be used, for example, to make the solar cell of FIG. 1. The thin solar cells were fabricated based on float-zone p-type c-Si films. Inverted nanopyramid structures were introduced into the top surface of the film (FIG. 8A). An n-type (P-1200, Desert Silicon) and p-type (B-200, Desert Silicon) spin-on-dopant (SOD) were deposited on the front and back surfaces, respectively (FIG. 8B). The deposited SODs were diffused into the vicinity of the surfaces at 960° C. for 2 hours (FIG. 8C). After this predeposition, the surfaces were cleaned (FIG. 8D) and tunneling $SiO_x$ layers were thermally grown at 700° C. for 5 minutes on the surfaces for the passivation (FIG. 8E). Because of the inverted nanopyramid structures, the $SiO_x$ layers were grown mostly on c-Si (111) planes on the front surface. To determine the $SiO_x$ layer thickness, an $SiO_x$ layer was grown on a c-Si(111) wafer at the same heating conditions and the $SiO_x$ layer thickness was measured. In an ellipsometry measurement (M-2000, J. A. Woollam), the thickness of a c-Si/$SiO_2$ transition layer was set at 1 nm and included this layer as a film of an effective refractive index in estimating the thickness of the $SiO_x$ layer. The $SiO_x$ layer thickness on the (111) surface was determined to be ~1.3 nm at our thermal growth condition. Then, to eliminate dangling bonds that potentially exist between the $SiO_x$/c-Si interfaces, the c-Si film was treated in a hydrogen gas at 400° C. for 10 minutes.

After the hydrogen treatment, intrinsic amorphous Si (i-aSi) layers were deposited by plasma-enhanced chemical vapor deposition (PECVD) on the $SiO_x$ surfaces at a thickness of 80 nm (FIG. 8F). To obtain high quality i-aSi layers it was desirable that the layers be free or substantially free from particles. A deposition condition was determined that prevents or reduces particle formation. Relatively thick (4-8 µm) i-aSi films were deposited by varying the radio frequency (RF) power and the pressure of a 5% silane gas in Ar ($P_{SiH4/Ar}$). At various deposition conditions, the mean diameter (d) and number density (ρ) of particles were measured on the deposited i-aSi films. Optical microscope images of the deposited i-aSi layers at example deposition conditions were employed to determine that PECVD at $P_{SiH4/Ar}$=450 mTorr and 300° C. and an RF power of 50 W resulted in high quality i-aSi layers.

To protect the i-aSi layers from contamination in a later step of dopant drive-in, 100-nm-thick $SiO_x$ layers were deposited on the i-aSi surfaces by PECVD. This step can be skipped if the fabrication facilities are contamination-free. After the protective layer deposition, the c-Si film was heated from 200° C. to 950° C. at a rate of 83° C./hour, and maintained at the constant temperature for 3 hours to drive-in the dopants both into the deeper c-Si regions and into the i-aSi layers through the tunneling $SiO_x$ layers (FIG. 8G). During this process, the i-aSi was simultaneously crystallized into polycrystalline Si. The polycrystalline Si layers were highly doped to make good Ohmic contacts with metal electrodes.

After the protective SiO$_x$ layer was removed, metal electrodes were fabricated (FIG. 8H). For top metal contact, a c-Si mask with grid openings was fabricated by laser grooving and subsequent KOH etching. Top contact resulting from e-beam metal evaporation on a cell covered by the mask included a contact pad, a 270-μm-wide bus bar, and metal fingers that are periodically placed in parallel to each other and perpendicular to the bus bar. The width of the metal fingers was 70 μm, and the spacing between neighboring fingers was 630 The top contact shaded about 10% of the front surface of a cell, and was comprised of Ti, Ag, and Pd layers from bottom up with thicknesses of 20 nm, 1500 nm, and 20 nm, respectively. Bottom metal contact (reflector) was fabricated by e-beam evaporation of Ag at a thickness of 1500 nm.

Finally, an 80-nm-thick SiN$_x$ antireflection layer was deposited on the front surface by PECVD at 300° C. (FIG. 8I). Refractive index of the SiN$_x$ layer was measured by spectroscopic ellipsometry and was determined to be 1.9 at 633 nm using the Cauchy model.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function.

Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A flexed, non-flat solar cell, comprising:
 a flexible substrate comprising symmetry breaking nanostructures; and
 a pn junction that is on or in the flexible substrate;
 wherein the flexible substrate has a thickness of about 25 microns or less,
 wherein the flexed, non-flat, solar cell is flexed to have a non-flat geometry that results in an increased surface area of the flexed, non-flat, solar cell with respect to a surface area of a flat solar cell that has the same projected area on a lateral plane as does the flexed, non-flat solar cell, and
 wherein the non-flat geometry comprises a wavy shape and the surface area of the flexed, non-flat, solar cell is at least 1.1 times greater than that of said flat solar cell covering the same area such that the solar cell has a surface area (Sw) larger than a projected area (So) on its lateral plane by a factor of Sw/So of 1.2 to about 10, and
 wherein the wavy shape enhances heat removal of the solar cell when heated by sunlight, such that a reduction in the photovoltaic efficiency of the solar cell due to the wavy shape is less than a gain in photovoltaic efficiency from the enhanced heat removal due to the wavy shape.

2. The solar cell of claim 1, wherein the flexible substrate comprises crystalline silicon.

3. The solar cell of claim 1, wherein the flexible substrate is freestanding.

4. The solar cell of claim 1, wherein the flexible substrate has a thickness of about 0.5 microns to about 25 microns.

5. The solar cell of claim 1, wherein top and bottom surfaces of the flexed, non-flat, solar cell comprise the wavy shape.

6. The solar cell of claim 5, wherein an average amplitude of the wavy shape is 0.5 millimeters (mm) to 1 meter.

7. The solar cell of claim 5, wherein the flexible substrate has a thickness of about 0.5 microns to about 25 microns.

8. The solar cell of claim 1, wherein the symmetry breaking nanostructures enhance photovoltaic efficiency of the flexed, non-flat, solar cell by light trapping,
 wherein the non-flat geometry enhances heat removal of the flexed, non-flat, solar cell, by increasing the surface area, and
 wherein the symmetry breaking nanostructures comprise a plurality of inverted nanopyramid arrays.

* * * * *